United States Patent [19]

Chao et al.

[11] 4,432,072

[45] Feb. 14, 1984

[54] NON-VOLATILE DYNAMIC RAM CELL

[75] Inventors: Hu H. Chao, Yorktown Heights; Donelli J. DiMaria, Ossining, both of N.Y.

[73] Assignee: International Business Machines Corporation, Armonk, N.Y.

[21] Appl. No.: 336,462

[22] Filed: Dec. 31, 1981

[51] Int. Cl.³ .................. G11C 11/24; G11C 11/34
[52] U.S. Cl. .................. 365/149; 365/185; 365/182
[58] Field of Search ............ 365/149, 182, 185, 222, 365/228; 307/238.8, 575, 584, 304, 246

[56] References Cited

U.S. PATENT DOCUMENTS

| | | | |
|---|---|---|---|
| 3,387,286 | 6/1968 | Dennard | 365/222 |
| 3,676,717 | 7/1972 | Lockwood | 307/304 |
| 3,811,076 | 5/1974 | Smith, Jr. | 357/41 |
| 3,900,747 | 8/1975 | Yamazaki et al. | 307/304 |
| 3,916,390 | 10/1975 | Chang et al. | 365/183 |
| 4,055,837 | 10/1977 | Stein et al. | 365/186 |
| 4,064,492 | 12/1977 | Schwermeyer et al. | 365/184 |
| 4,175,291 | 11/1979 | Spence | 365/184 |
| 4,207,615 | 6/1980 | Mar | 365/95 |
| 4,336,603 | 6/1982 | Kotecha et al. | 365/182 |
| 4,363,110 | 12/1982 | Kalter et al. | 365/149 |

OTHER PUBLICATIONS

D. J. DiMaria et al., "Electrically-Alterable Memory Using a Dual Electron Injector Structure", IEEE Electron Device Letters, vol. EDL-I, No. 9, Sep. 1980, pp. 179-181.

D. J. DiMaria et al., "High Current Injection into SiO₂ from Si Rich SiO₂ Films and Experimental Applications", Journal of Applied Physics 51(5), May 1980, pp. 2722-2735.

Primary Examiner—Joseph A. Popek
Attorney, Agent, or Firm—Hansel L. McGee; Carl C. Kling

[57] ABSTRACT

This invention provides improved non-volatile semiconductor memories which include a one device dynamic volatile memory circuit having a switching device, a storage capacitor and a non-volatile floating gate device disposed between the storage node and the switching device. The non-volatile floating gate device has a floating gate, a floating gate FET, a control gate and a voltage divider having first and second serially-connected capacitors, with the floating gate being disposed at the common point between the first and second capacitors. One of the capacitors includes a dual charge or electron injector structure and the capacitance of this capacitor has a value substantially less than that of the other capacitor.

31 Claims, 14 Drawing Figures

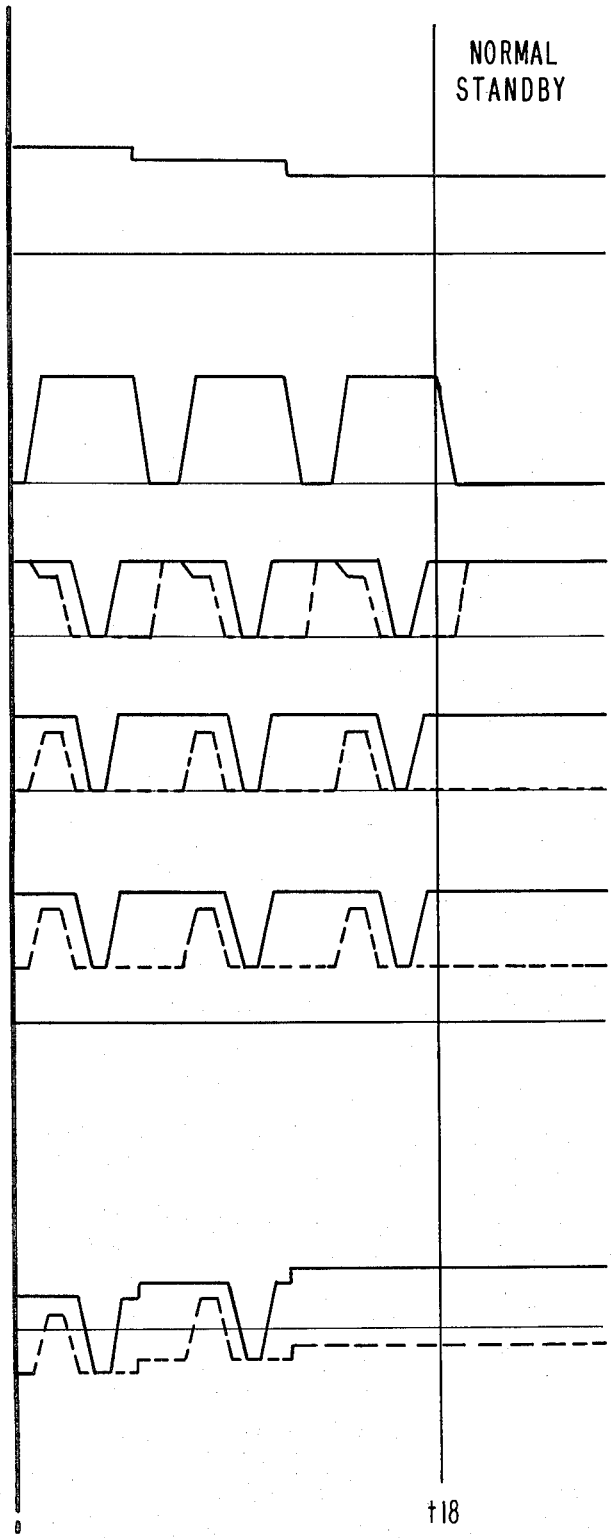

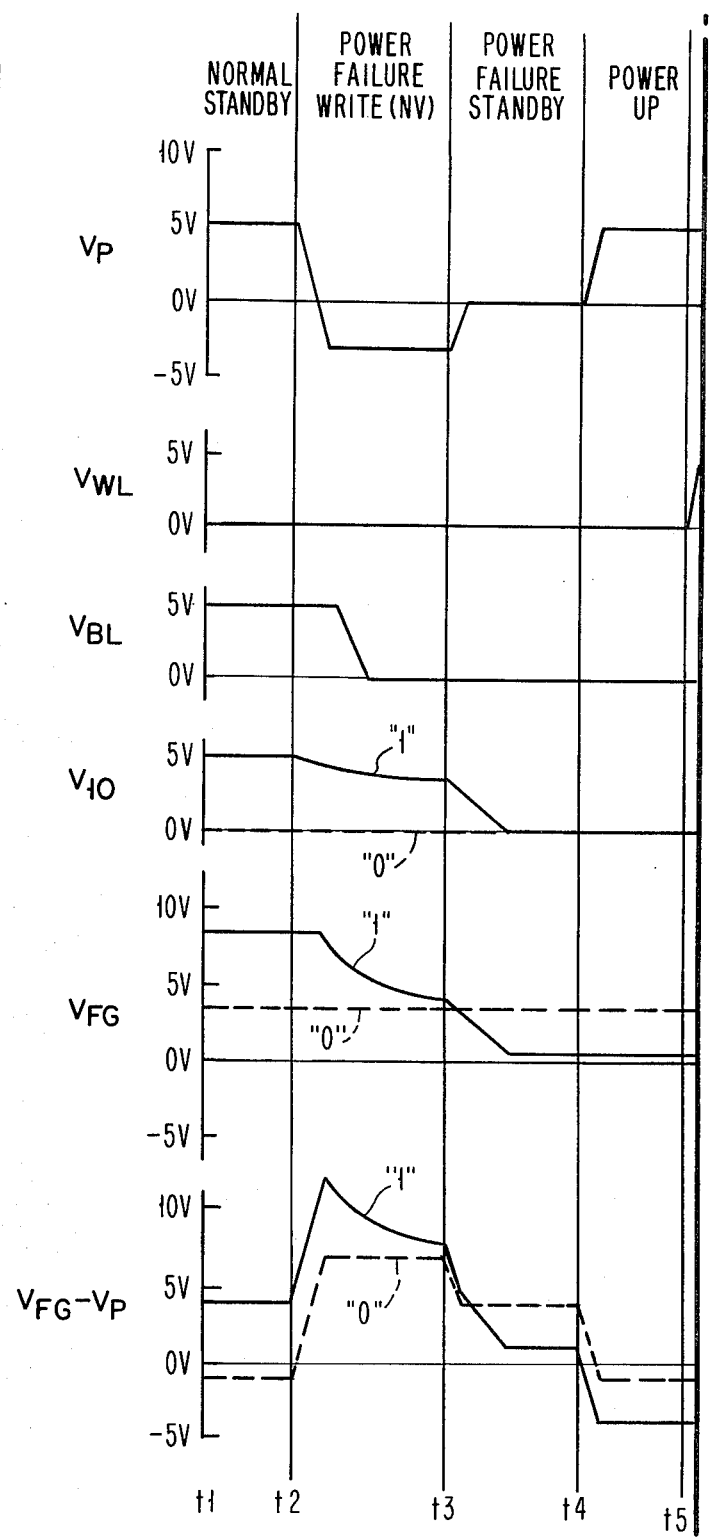
FIG. 4.1

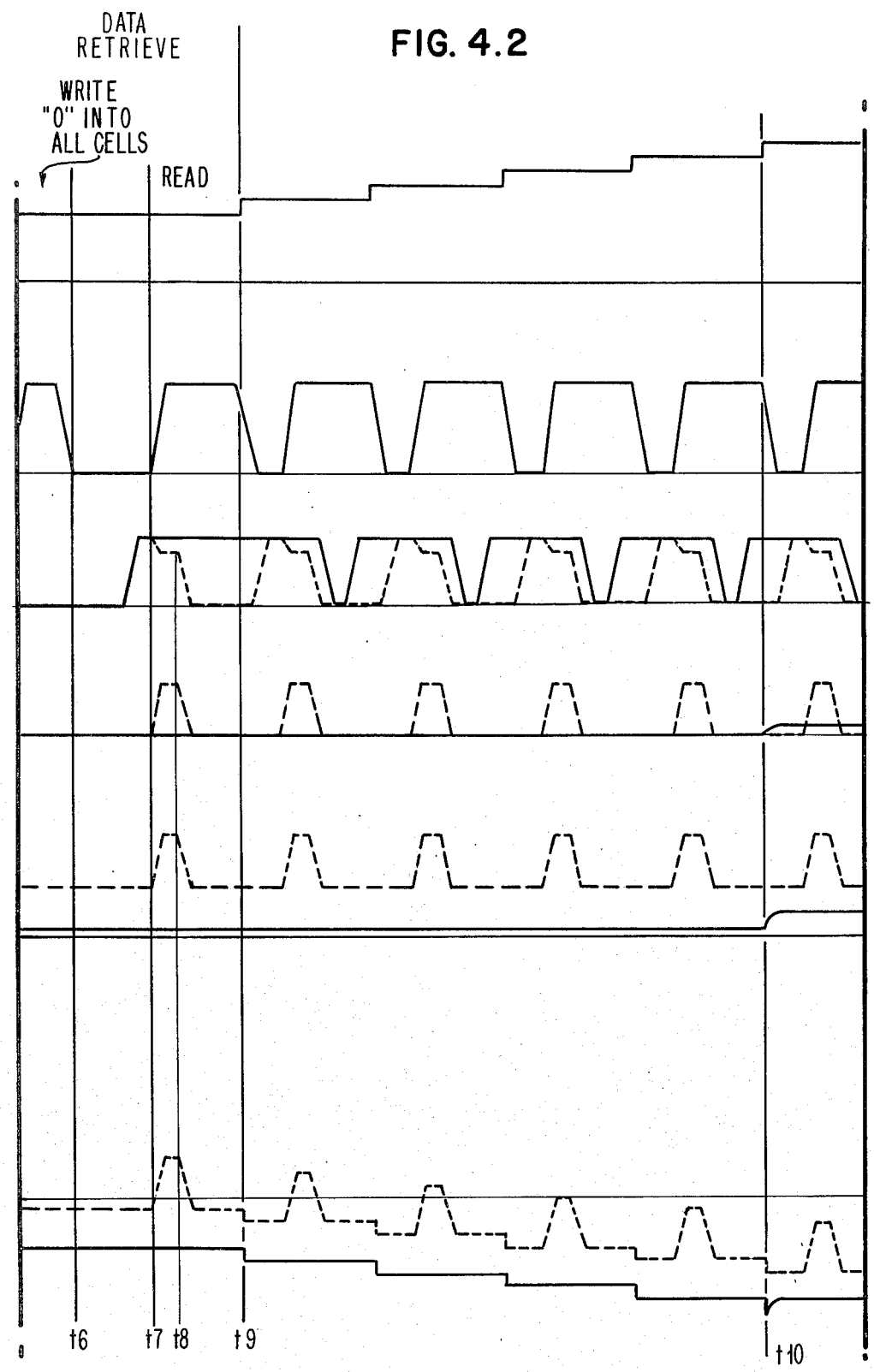
FIG. 4.2

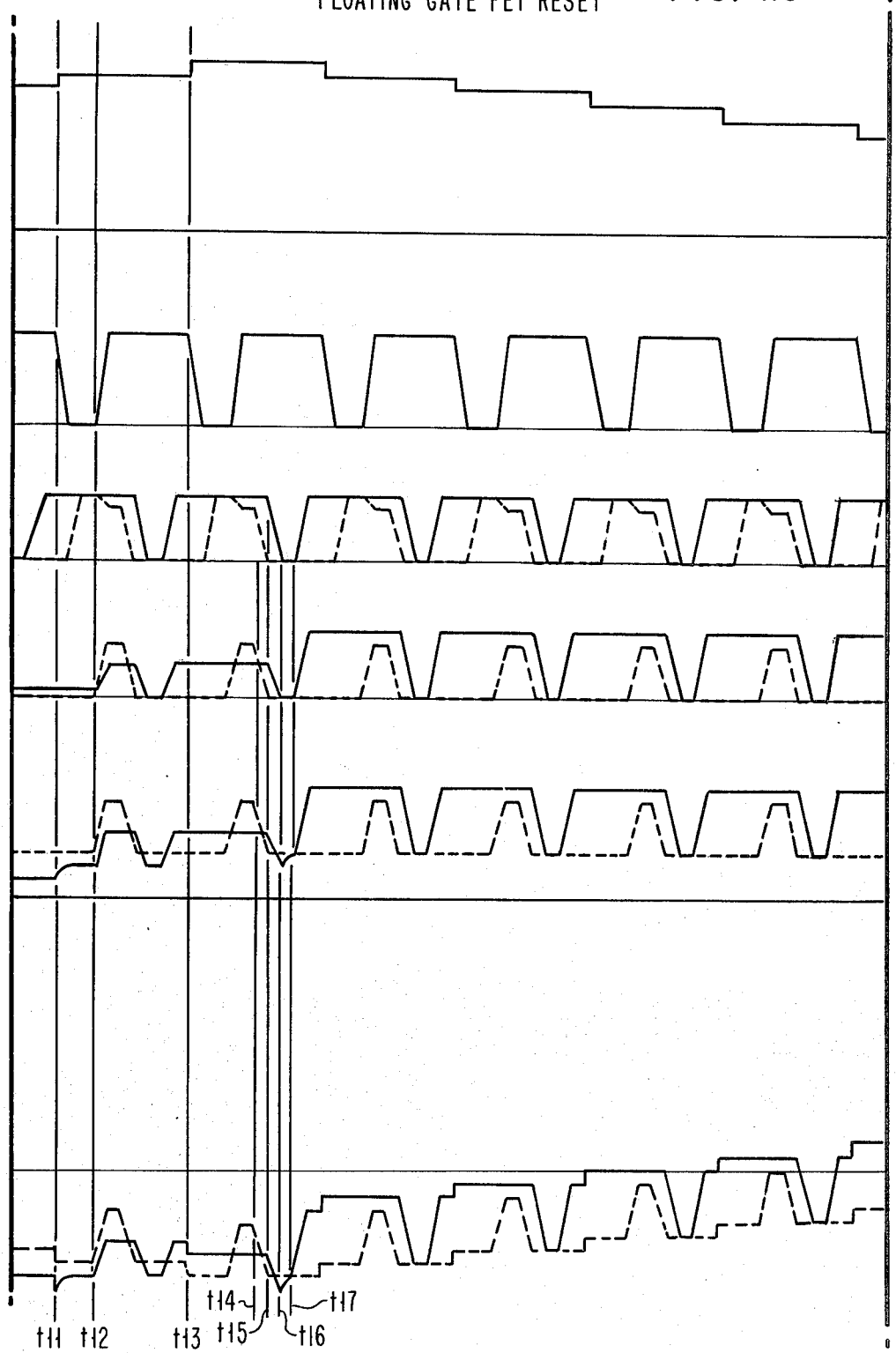

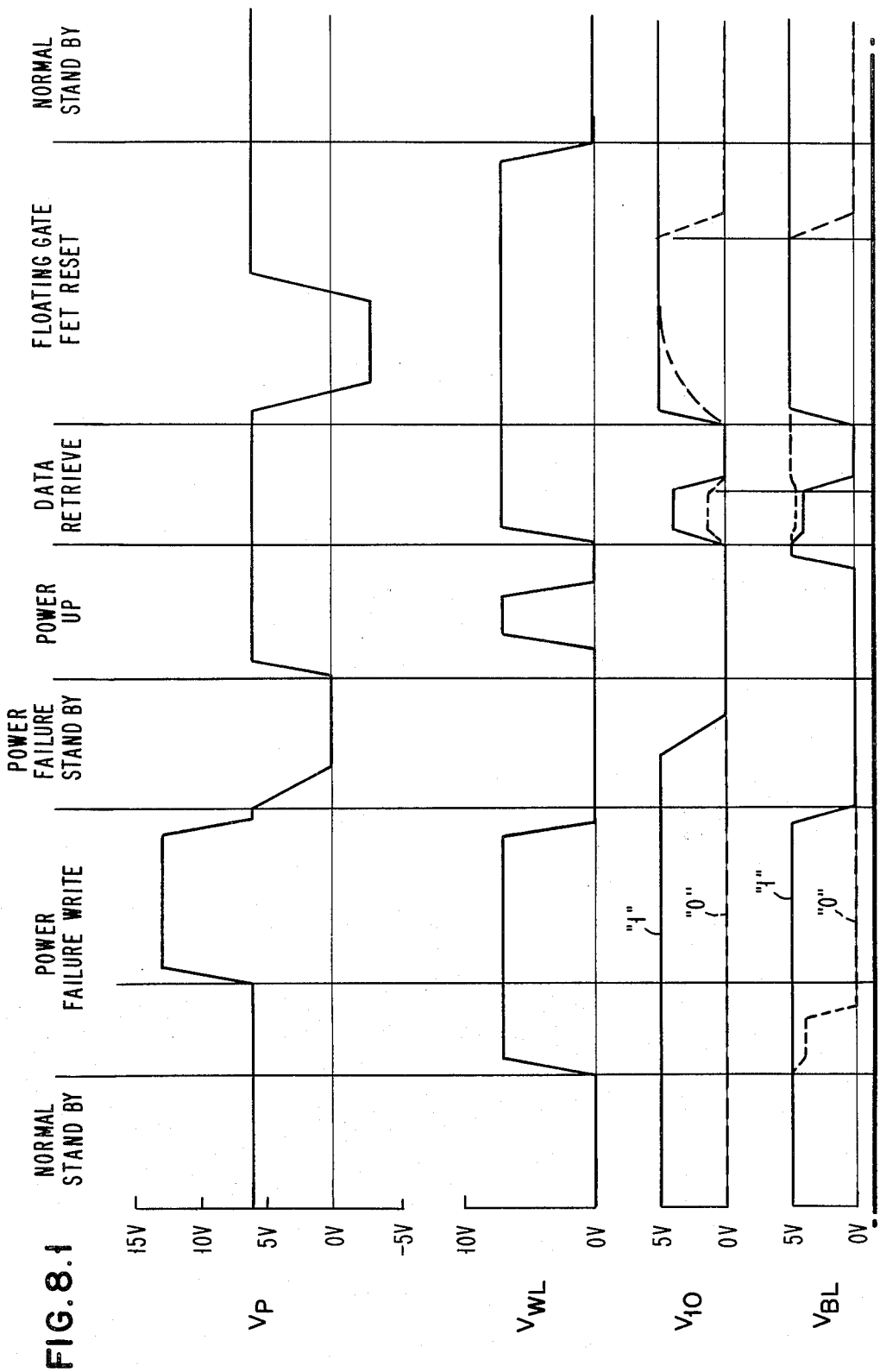
FIG. 8.1

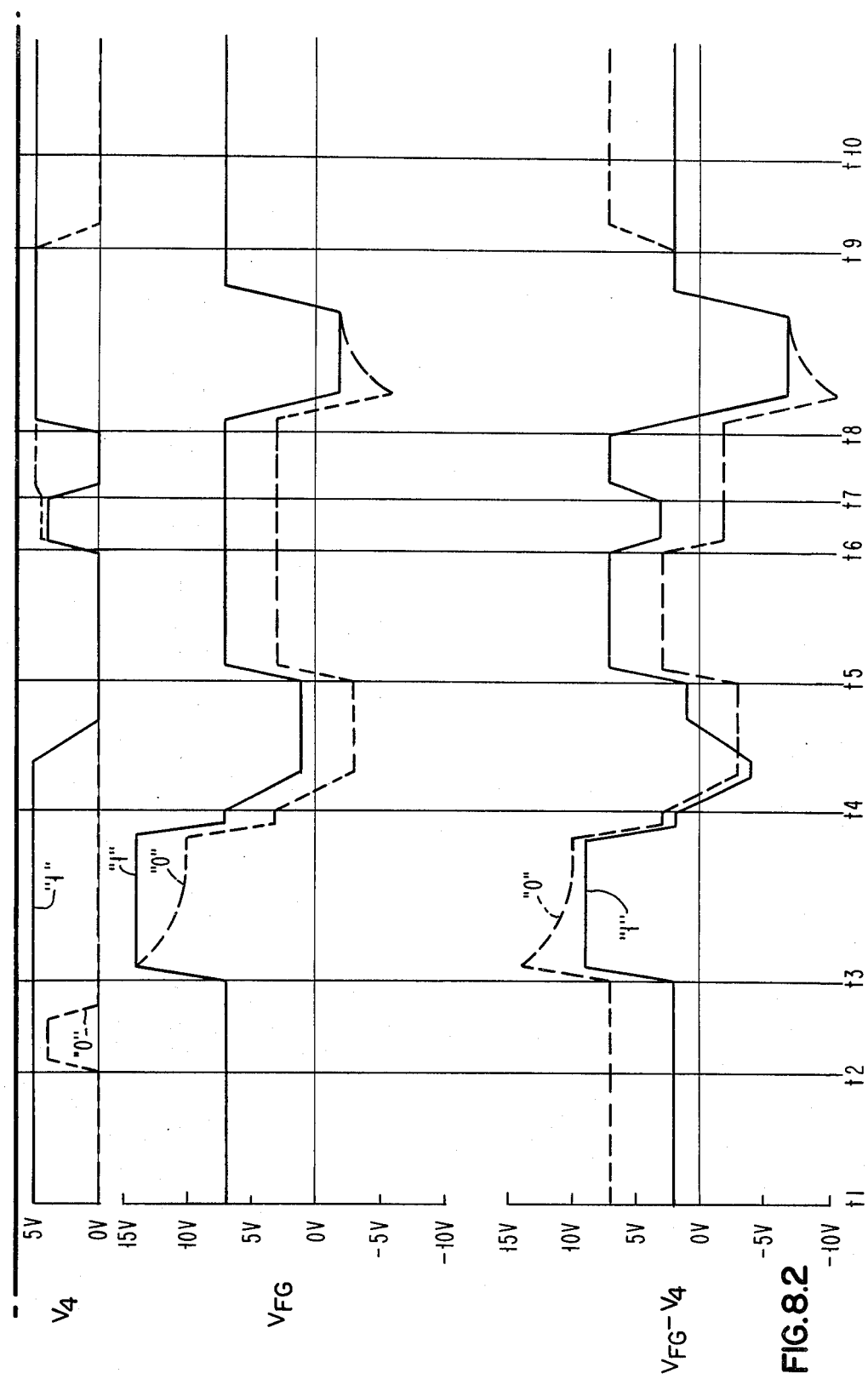
FIG.8.2

NON-VOLATILE DYNAMIC RAM CELL

DESCRIPTION

1. Technical Field

This invention relates to non-volatile semiconductor memory cells and more particularly to cells which utilize a device having a floating gate and, preferably, an enhanced conduction insulator.

2. Background Art

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

Known devices capable of providing variable threshold voltages, such as field effect transistors having metal-nitride-oxide-silicon (MNOS) and field effect transistors having a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

The non-volatile memory cells which use non-volatile MNOS transistors or devices are capable of retaining for long periods of time information stored volatilely in a cell but these devices require high voltage pulses for writing and erasing the information, they are slow and they require rather complex processes for their fabrication. An example of a non-volatile semiconductor memory cell is taught in U.S. Pat. No. 3,676,717, filed Nov. 2, 1970.

Known non-volatile memory cells which use conventionally arranged floating gate devices are also capable of preserving for long periods of time information stored volatilely in a cell but these devices likewise have required high voltage pulses for writing and erasing the information; they have been slow and required high currents, approximately one milliampere per device, to write. An example of a known non-volatile semiconductor memory cell having incorporated therein a floating gate is taught in U.S. Pat. No. 4,207,615, filed Nov. 17, 1978.

In commonly assigned U.S. patent application Ser. No. 192,579, filed on Sept. 30, 1980, now U.S. Pat. No. 4,388,704, by C. L. Bertin, H. N. Kotecha and F. W. Wiedman, there are disclosed non-volatile static memories which include a volatile circuit coupled to a non-volatile device having a floating gate and first and second control gates capacitively coupled to the floating gate which a charge injector structure including enhanced conduction insulators disposed between the floating gate and one of the two control gates. A detailed discussion of enhanced conduction insulators may be found in an article entitled "High Current Injection into $SiO_2$ from Si Rich $SiO_2$ Films and Experimental Applications" by D. J. DiMaria and D. W. Dong, Journal of Applied Physics 51(5), May 1980, pp. 2722–2735, and a basic memory cell which utilizes the dual electron injector structure is taught in an article entitled "Electrically-Alterable Memory Using a Dual Electron Injector Structure" by D. J. DiMaria, K. M. DeMeyer and D. W. Dong, IEEE Electron Device Letters, Vol. EDL-1, No. 9, September 1980, pp. 179–181.

Highly dense dynamic random access memory (RAM) cells having only a single storage capacitor and a single switch or transistor are disclosed in commonly assigned U.S. Pat. Nos. 3,387,286, filed on July 14, 1967, by R. H. Dennard and 3,811,076, filed on Jan. 2, 1973, by W. M. Smith.

One device dynamic volatile memory cells having the capability of storing data non-volatilely are known. For example, commonly assigned U.S. Pat. No. 3,916,390, filed Dec. 31, 1974, by J. J. Chang and R. A. Kenyon discloses the use of a dual insulator made of silicon dioxide and silicon nitride for storing information non-volatilely during power failure. Other examples of dynamic cells capable of storing non-volatilely by using MNOS structures include U.S. Pat. Nos. 4,055,837, filed Oct. 22, 1975, by K. U. Stein et al and 4,175,291, filed Oct. 31, 1977, by W. Spence. These dynamic cells having non-volatile capability can operate satisfactorily, however, they generally require larger cell areas, larger voltages for the volatile operating mode or backup memory.

More recently, in application Ser. No. 219,285, now U.S. Pat. No. 4,363,110, to a common assignee, there is provided an improved one device dynamic volatile memory cell having the capability of storing data non-volatilely. The device uses a floating gate for storing information non-volatilely during power failure. To recover data after power has been restored, charge is transferred from a floating gate back to a storage node whereby the charge is partially depleted. In the most optimal case at ideal conditions the resultant charge is only 25% of the original stored charge. Therefore, in order to insure that the resultant signal is sufficiently large for sensing, the storage capacitance has to be at least 4 times larger than normal to insure a signal strong enough to be detected. Consequently large cell sizes are required.

FIG. 9 is a schematic circuit diagram of the non-volatile memory cell of application Ser. No. 219,285. This figure is referred here to show that the resultant charge after data retrieve operation is only 25% of the original stored charge in the most optimized case at ideal conditions. This cell includes a storage capacitor $C_s$, and an input/output line I/O which may be interconnected by a switching device 14, preferably a field effect transistor. A voltage $V_P$ is applied to terminal P connected to capacitor plate 12. Voltage divider circuit 16, having serially-connected first and second capacitors C1 and C2, respectively, is connected between the storage node 10 and a terminal C having control voltage $V_c$ applied thereto. A floating gate, identified by terminal FG, is disposed between the first and second capacitors C1 and C2. A parasitic capacitor $C_P$, which is generally present, is indicated as being located between the storage node 10 and a semiconductor substrate indicated at S. The first capacitor C1 is preferably a dual charge or electron injector structure of the type described in the hereinabove cited IEEE Electron Device Letters article.

In calculating the resulting charge after a retrieval operation, the best case conditions $C_2 >> C_1$, $C_2 >> C_P$, $C_s >> C_1$ and $C_s >> C_P$ were used. In the normal operation, the voltage of the floating gate FG is at $V_{FG}$ when the voltage at storage node 10 is at zero volts and $V_P$ and $V_C$ are both at $V_{DD}$. When the voltage at the storage node 10 is at $V_{DD}$ representing a binary bit "1", the voltage of the floating gate FG will be $V_{FG} + V_{DD}$. The stored charge available to distinguish "0" and "1" is $C_s V_{DD}$. When power failure is detected, the storage capacitor plate 12 has applied thereto an appropriate positive voltage $V_{DD} + \Delta V_P$ through terminal P and the voltage at terminal C is at zero volts. As a result, the voltage at the floating gate FG rises to $V_{FG} + \Delta V_P$ or $V_{FG} + \Delta V_P + V_{DD}$ for binary bit "0" and "1", respectively. With the best possible design, the negative threshold voltage of the dual charge or electron injector structure of C1 is equal to $-(V_{FG} + \Delta V_P)$; thus, no charge transfer takes place for binary bit "0".

For binary bit "1", current will flow thru C1 and discharge the floating gate FG to $V_{FG} + \Delta V_P$. Due to capacitive coupling thru C2, the voltage at the storage node 10 will reduce to $$V_{DD} + \Delta V_P - \frac{C_2}{C_2 + C_s} V_{DD}.$$

The total charge transfer in this operation is equal to $$\frac{(C_2)}{C_2 + C_s} C_s V_{DD}.$$

In this manner, the data from node 10 is stored in a non-volatile node in the floating gate FG.

To retrieve data from the floating gate FG, first the storage node 10 is set to zero volts while both $V_P$ and $V_C$ are set at $V_{DD}$. The floating gate FG will have a voltage of $V_{FG}$ or $$V_{FG} - \frac{C_s}{C_2 + C_s} V_{DD}$$

for a data of "0" or "1" respectively. Next, the control terminal C has applied thereto a pulse having an appropriate positive voltage $\Delta V_C$. As a result the voltage across C1 is $\Delta V_C - V_{FG}$ for a binary "0" and $$\Delta V_C - V_{FG} + \frac{(C_s)}{C_2 + C_s} V_{DD}$$

for a binary "1". With the best possible design, the positive threshold voltage of the dual charge or electron injector structure of C1 is $\Delta V_C - V_{FG}$. Therefore, current will flow thru C1 and charge the floating gate FG to $V_{FG}$. The voltage at the storage node 10 will increase to $$\frac{(C_2)}{C_2 + C_s} \frac{(C_s)}{C_2 + C_s} V_{DD}.$$

The The maximum of $$\frac{(C_2)}{C_2 + C_s} \frac{(C_s)}{C_2 + C_s}$$

is equal to 0.25 occurs when $C_2 = C_s$. Therefore, the signal at the storage node 10 is, at best, only 25% of the original signal swing $V_{DD}$.

DISCLOSURE OF THE INVENTION

It is an object of this invention to provide an improved non-volatile dynamic semiconductor memory which is denser and more versatile than such known memories.

It is another object of this invention to provide an improved non-volatile dynamic semiconductor memory which operates at lower voltages in the volatile mode and requires less power during data transfer between volatile and non-volatile modes.

It is yet another object of this invention to provide an improved non-volatile dynamic semiconductor memory, preferably using an enhanced conduction or silicon-rich insulator, which operates faster than known non-volatile memories.

It is still another object of this invention to provide a dynamic memory system that can store non-volatilely the previously stored data and also can store any new data in a volatile mode, thereby effectively yielding a double dense memory system.

It is a further object of this invention to provide a non-volatile memory system where all volatile data from all cells is preferably transferred to a non-volatile mode in a parallel operation or in one cycle of operation.

It is yet a further object of this invention to provide a non-volatile memory system where both erasure of non-volatile memory and restoration of volatile data occurs simultaneously for all cells of the system.

In accordance with the teachings of this invention improved non-volatile semiconductor memories are provided which include a one device dynamic volatile memory circuit having a floating gate FET disposed between a switching device and a storage node of the conventional one device dynamic volatile memory. The floating gate FET is normally at a conductive state and the memory cell operation is exactly the same as that of a conventional one device dynamic memory. At power failure, the floating gate FET is discharged via a dual electron injector structure according to the data stored in the memory cell. When power returns, the data can be retrieved by sensing whether the floating gate FET is in conductive state or in nonconductive state.

The foregoing and other objects, features and advantages of the invention will be apparent from the following and more particular description of the preferred embodiments of the invention, as illustrated in the accompanying drawings.

BRIEF DESCRIPTION OF THE DRAWINGS

FIGS. 4.1, 4.2, 4.3 and 4.4 arranged as in FIG. 4 illustrate a pulse program which may be used to operate the cell of FIG. 2 and the system illustrated in FIG. 3 of the drawings.

FIGS. 5, 6, 7, 8.1 and 8.2 and the circuit diagram, sectional view of the memory system and illustrative pulse diagram of another embodiment of the non-volatile memory cell of the present invention.

BEST MODE FOR CARRYING OUT THE INVENTION

Figure 1:
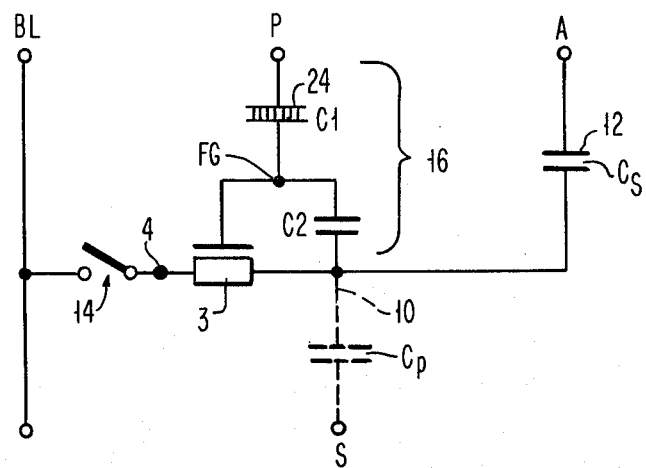
FIG. 1 is a circuit diagram of the non-volatile memory cell of the present invention.

Referring to FIG. 1 of the drawings in more detail, there is shown the circuit diagram of the non-volatile dynamic memory cell of the present invention. This cell includes a storage capacitor ($C_s$), and a bit line (BL) which may be interconnected by a switching device 14, preferably a field effect transistor. A voltage $V_P$ is applied to terminal P connected to capacitor plate or control gate 24. Capacitor C1 is serially connected to capacitor C2 and forms voltage divider circuit 16. C2 is connected between a storage node 10 and the floating gate FG. A floating gate FET 3 is disposed between switching device 14 and storage node 10. The floating gate FET 3 is connected to switching device 14 via switching node 4. The top electrode of the storage capacitor $C_s$ 12 is connected to terminal A which is biased at a constant voltage such as the power supply voltage ($V_{DD}$) or at ground potential. Parasitic capacitors $C_P$ which is generally present is indicated as being located between the storage node 10 and a semiconductor substrate S. The first capacitor C1 is preferably a dual charge or electron injector structure (DEIS) of the type described in the hereinabove cited IEEE Electron Device Letters article.

In the normal operation of the circuit or cell of FIG. 1 of the drawings, the floating gate FET 3 is always in a conductive state; thus switching device 14 and the storage node 10 are connected. The storage capacitor $C_s$, the bit line BL and the switching device 14 function as a volatile dynamic one device memory cell. When power failure is detected, the control gate 24 has applied thereto an appropriate negative voltage through terminal P. As a result of this negative voltage, a voltage is developed across capacitor C1. If the voltage on the storage node 10 is at +5.0 volts representing a binary bit "1", the voltage across the capacitor C1 is of sufficient value to cause current flow through the DEIS, whereby the normally positively charged floating gate FG is caused to become less positive. On the other hand, if the voltage on storage node 10 is at zero volts, representing a binary bit "0", no charge transfer between the control gate 24 and the floating gate FG takes place. In this manner, the data from node 10 is stored in a non-volatile mode in the floating gate FG.

To retrieve the data from the floating gate FG when power is resumed, the control gate 24 is biased at $V_{DD}$. Then the conventional means of writing "0" in a one device FET dynamic RAM cell is performed to set the potential at node 4 and node 10 to ground. However, node 10 can be set to ground only when the floating gate FET 3 is made conductive. The cell is then read by conventional means. When the floating gate FET 3 is conductive, a "0" will be read out. When the floating gate FG is negatively charged during non-volatile writing, the floating gate FET is not conductive and "1" will be read out.

For normal operation, the floating gate FET 3 needs to be reset to the conductive state. To reset the floating gate FET 3, the voltage applied to node P is gradually increased while the memory cell is refreshed periodically. As long as during each refresh period the potential change at node P is small enough, the data will not be disturbed. After the floating gate FG has been reset to have positive charge, the voltage at node P is gradually decreased while the memory cell is refreshed periodically. Again, as long as during each refresh period the potential change at node P is small enough, the data will not be disturbed. When the voltage at P is returned to $V_{DD}$, the device is ready for normal operation.

Since a non-volatile write operation, i.e., charge transfer, occurs only when the voltage on the storage node 10 is at a high value, representing a "1" bit binary information, the second capacitor C2 should have a very much larger capacitance than the first capacitor C1. This arrangement ensures that most of the voltage appearing on the storage node 10 is capacitively coupled to the floating gate FG. As a result, a large differential voltage is provided which readily distinguishes between a binary bit "1" and a "0". The capacitance $C_s$ should be much larger than C1 to avoid significant change of the potential at node 10 during the non-volatile write operation.

A major advantage of the present invention over the prior art is the inclusion of floating gate FET 3. The floating gate FET is provided to take advantage of the boosting effect of C2 to allow full voltage swing at storage mode. In the prior art, e.g., application Ser. No. 192,579, this boosting effect was detrimental to the device operation; it is used to good advantage in the present device. Because of the addition of floating gate FET 3, greater density in structure design can be obtained. Its presence permits the size of capacitor C2 to be reduced fourfold.

Figure 2:
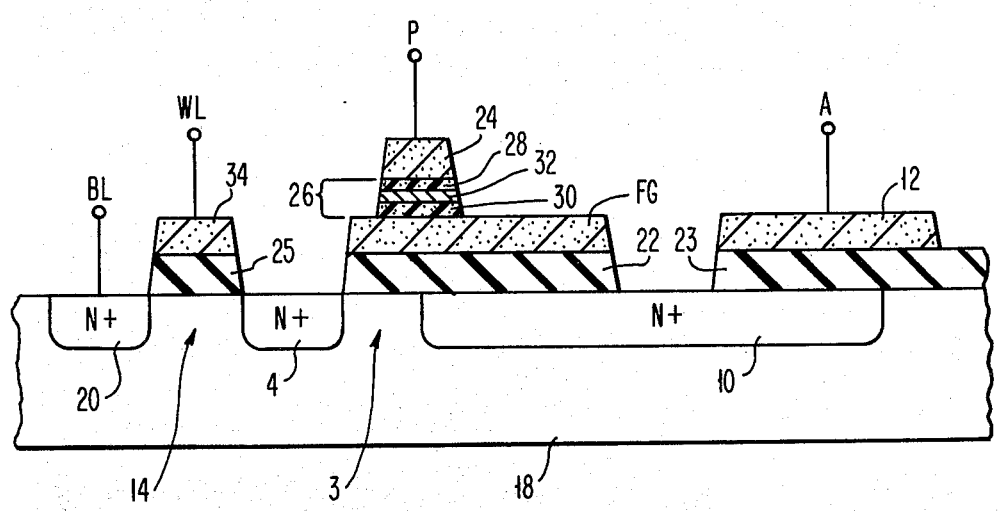
FIG. 2 is a sectional view of an embodiment of the circuit of the present invention illustrated in FIG. 1 of the drawing.

An embodiment of the circuit or cell of the present invention is illustrated in a sectional view in FIG. 2 of the drawings. A P-type silicon substrate 18 has a N+ diffusion region forming the storage node 10, a switching node 4 and a N+ diffusion region 20 forming the bit line. The floating gate FG is separated from the storage node 10 by a thin insulating layer 22, preferably made of silicon dioxide, forming the second capacitor C2. The capacitor C1 is formed by the floating gate FG and capacitor plate 24, which is connected to control terminal P. A dual electron injector structure 26 (DEIS) which includes first and second silicon-rich silicon dioxide layers 28 and 30 separated by a silicon dioxide layer 32, is situated between floating gate FG and control gate 24. The storage capacitor $C_s$ is formed by the capacitor plate 12, storage node 10 and silicon dioxide layer 23. The switching device or transistor 14 is formed by a gate electrode 34, which is disposed between the bit/sense line diffusion region 20 and node 4 and separated from the surface of the silicon substrate 18 by the silicon dioxide layer 25. The gate electrode 34 is connected to a word line terminal WL. The floating gate FG is extended over the storage node 10 to form capacitor C2. The floating gate FET 3 is formed in the substrate area between nodes 4 and 10.

Figure 3:
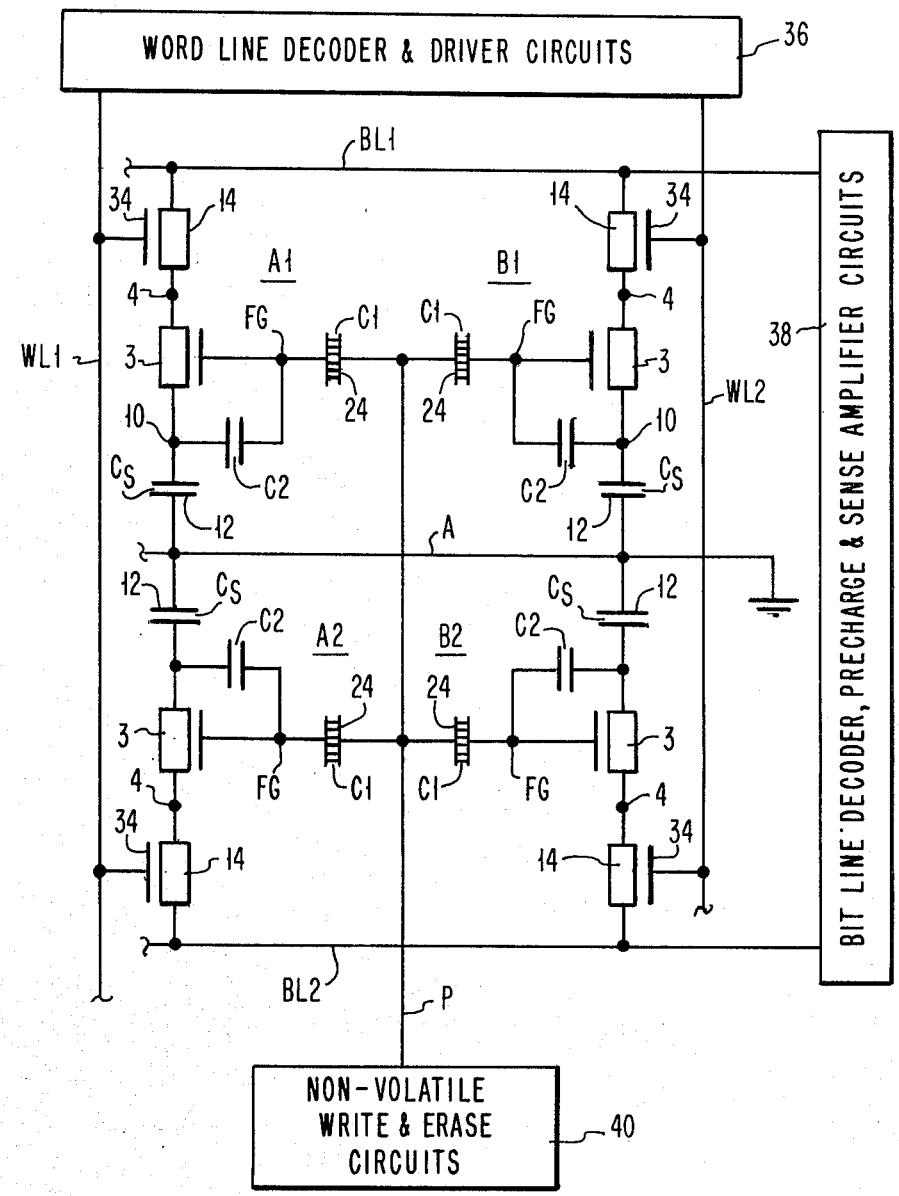
FIG. 3 illustrates a memory system of the present invention having an array of cells each of which may be of the type illustrated in FIG. 2 of the drawings.

FIG. 3 illustrates a 2×2 array of non-volatile memory cells of the type shown in FIGS. 1 and 2 of the drawings wherein similar elements in the two figures are identified by the same reference characters. The array includes a first word line WL1 to which first and second cells A1 and A2 are connected and a second word line WL2 to which a third cell B1 and fourth cell B2 are connected. First and third cells A1 and B1 are connected to a first bit line BL1 and the second and fourth cells A2 and B2 are connected to a second bit line BL2. The first and second word lines WL1 and WL2 are connected to word line decoder and driver circuit 36 which may employ conventional circuitry and the first and second bit lines BL1 and BL2 are connected to bit line decoder, precharge and sense amplifier circuits 38 which may also utilize conventional circuitry. The control terminal or line P is connected to non-volatile write and erase circuits 40, which may be of any known type.

In order to better understand the operation of the non-volatile memory cell illustrated in FIGS. 1 and 2 and also of the system illustrated in FIG. 3, reference may be made to an illustrative pulse program indicated in FIG. 4 of the drawings. In FIG. 4 voltage ($V_{DD}$) and a $-3$ V substrate bias voltage have been assumed. Other convenient voltage levels can also be used. During normal operation of a non-volatile memory cell illustrated, e.g., a cell A1 in FIG. 3 of the drawings, the cell performs as a conventional one device storage circuit coupled to the first bit line BL1 and the first word line WL1 and the voltages therein may be those indicated in FIG. 4 of the drawing between times t1 and t2, with constant voltages being applied to terminal P having a magnitude of, say, $+5$ volts. For a stored binary bit "0", the voltage on storage node 10 is, say, zero volts and then the voltage on the floating gate FG will be at approximately 3.5 volts. For a stored binary bit "1", the storage node 10 is preferably at $+5$ volts for illustration purposes. The potential at the floating gate FG is boosted up from 3.5 volts to about 8.5 V through the capacitive coupling via capacitor C2. This boost mechanism is critical for the device operation because it is this boost mechanism which allows the storage node to be charged up to 5 V when a "1" is written into the cell. As indicated in FIG. 4 of the drawings, applied voltage $V_{BL}$ on the bit/sense line BL, the resulting voltage $V_{10}$ on the storage node 10, the resulting voltage $V_{FG}$ on the floating gate FG and the resulting voltage $V_{FG}-V_P$ produced across the dual electron injector structure or capacitor C1 are shown in solid lines for stored binary "1" bits and in dashed lines for stored binary "0" bits.

When power failure is detected, the voltage on the control gate 24 is decreased from 5 volts to $-3$ volts (the substrate bias voltage) as indicated in FIG. 4, at time t2. Since C1 is much smaller than C2 and $C_s$, the potential of the floating gate FG and the storage node 10 will not be changed significantly. The voltage across C1 will be 12 volts for the cell storing a binary bit "1" and is sufficient to conduct discharging current from floating gate FG to the control gate 24. The result is that the positive charge on the floating gate FG is discharged. In case of a cell storing binary bit "0", the voltage across C1 will be only 7 volts which is by design not sufficient to significantly alter the charge on the floating gate FG since this voltage is equal to or less than the turn-on voltage of the dual electron injector structure 26.

Between time t3 and t4, all applied voltages are at zero volts. The potential at storage node 10 will also return to zero volts due to leakage current. The voltage across C1 is less than 4 volts and thus the potential of the floating gate FG [3.5 volts for a cell with binary bit "0" stored and 0.5 volts for a cell with binary bit "1" stored] will be kept for a very long period of time.

When power is again turned on or resumed at t4, the control gate is again biased at 5 volts. To retrieve the data stored before the power down, the conventional means of writing "0" is performed between t5 and t6 to set the potential at node 4 and node 10 to ground. However, for a cell with a "1" stored, node 10 is isolated because the floating gate FET 3 is in nonconductive state. Between t7 and t9, the cell is read by the conventional means. When the floating gate FET 3 is conductive, a charge sharing between the bit line BL (which is the charged to 5 volts) and the storage node 10 (which is preset to ground) will result in a voltage drop on the bit line BL. Thus there will be provided a negative differential signal with respect to the reference signal provided by the reference cell as in the conventional dynamic one device FET RAM operation. At t8, the sense amplifier is activated to pull down the bit line to ground and rewrite the potential at storage node 10 to zero. In this case a "0" is read out. For a cell with a "1" stored before the power down, the floating gate FET 3 has been discharged to the nonconductive state; thus the BL potential will be kept at $V_{DD}$ and results in a positive differential signal with respect to the reference signal. When the sense amplifier is activated, this positive differential signal causes the BL to be held at $V_{DD}$. In this case, a "1" is read out. Therefore, the data stored before the power down can be retrieved.

In the case that a "1" was stored before the power down and the floating gate FET 3 has been discharged to the nonconductive state, it is required to reset the floating gate FET 3 to the conductive state for normal operation. To avoid the need of a temporary storage, the reset operation can not disturb the stored information in the memory cell. As the potential at node P increase, the voltage across C1 increases. At t10, the voltage across C1 is sufficient to cause charge flow from the control gate 24 to the floating gate FG and charging up to FG to 1.5 volts. At t11, the floating gate FG is charged up to 2.5 volts and the floating gate FET 3 is now in the conductive state. When the word line WL is activated at t12, the storage node 10 will be charged up to 2.5 volts while the floating gate FG is boosted to near 5 volts.

However, because of the boost up of the floating gate FG, when $V_P$ increasing again at t13, the voltage across C1 is less than the voltage across C1 at t10 and t11, resulting in no charging up current. To solve this problem, the conventional refresh operation has been modified. After the activation of the sense amplifier at t14, the sense amplifier is disconnected from the BL and the BL is connected to ground at t15. When the BL is discharged to ground, the storage node 10 will be discharged to ground at t16 thus eliminating the voltage boost of the floating gate FG. At t16, the voltage across C1 will be sufficient to charge up the floating gate to the original condition. At t17, BL is connected with the sense amplifier circuits.

In the case that a "1" is latched in the sense amplifier, the BL will be charged up to 5 volts thus the storage node 10 will be charged up to 5 volts and the floating gate FG will be boosted up to 8.5 volts. Then the control gate bias $V_P$ decreases gradually to 5 volts at t18 and the device is ready for normal operation.

As indicated hereinabove, each of the cells A1, A2, B1 and B2 illustrated in the system illustrated in FIG. 3 of the drawings may be operated in accordance with the illustrative pulse program shown in FIG. 4. As also noted hereinabove, cell A1 is operated by selecting word line WL1 and bit/sense line BL1, while cell A2 is operated by selecting word line WL1 and bit/sense line BL2, cell B1 is operated by selecting word line WL2 and bit/sense line BL1 and cell B2 is operated by selecting word line WL2 and bit/sense line BL2. The voltage $V_P$ is produced in non-volatile write and erase circuits 40, which may be provided on-chip or by the system using this memory, and is applied to control terminal P which is common to all cells A1, A2, B1 and B2.

Figure 5:
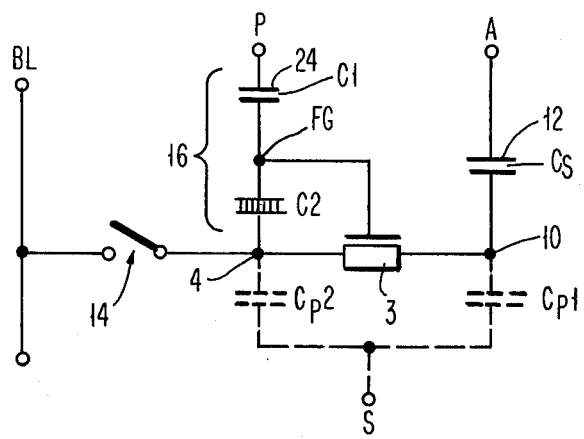

Another embodiment of the floating gate FET 3 disposed between the switching device 14 and the storage node 10 of the conventional one device dynamic volatile memory is shown in FIG. 5.

This cell includes a storage capacitor $C_S$, and a bit line BL which may be interconnected by a switching device 14, preferably a field effect transistor. A voltage $V_P$ is applied to terminal P connected to capacitor plate 24 or control gate voltage divider circuit 16 having serially-connected first and second capacitors C1 and C2, respectively.

A floating gate FET 3 is disposed between node 4 and the storage node 10. The top electrode of the storage capacitor $C_S$ is connected to terminal A which is biased at a power supply voltage ($V_{DD}$) or at ground potential.

Parasitic capacitors ($C_{P1}$) and ($C_{P2}$) which are generally present are indicated as being located between the storage node 10 and switching node 4 and a semiconductor substrate. The second capacitor C2 is preferably a dual charge or electron injector structure of the type described in the hereinabove cited IEEE Electron Device Letters article.

In the normal operation of the circuit or cell of FIG. 5 of the drawings, the floating gate FET 3 is in a conductive state; thus node 4 and the storage node 10 are connected. The storage capacitor $C_S$, the bit line BL and the switching device 14 function as a volatile dynamic one device memory cell. When power failure is detected, the data is first read in the normal manner. The sense amplifier will hold the bit line high (5 V) or near ground according to the stored data in the dynamic RAM. With the switch 14 connected, a high positive voltage is applied to the control gate 24. As a result of this pulse, a voltage is developed across the second capacitor C2. If the voltage on the storage node 10 is at 0 volts representing a binary bit "0", the voltage across the capacitor C2 is of sufficient value to charge the floating gate FG in a negative direction. On the other hand, if the voltage on storage node 10 is at 5 volts, representing a binary bit "1", no charge transfer takes place. In this manner, the data from node 10 is stored in a non-volatile mode in the floating gate FG.

To retrieve data from the floating gate FG, the control gate 24 is biased at $V_{DD}$. Then the conventional means of writing "0" is performed to set the potential at node 4 and 10 to ground. However, node 10 can be set to ground only when the floating gate FET 3 is conducting. Then the cell is read with the conventional means of the one device dynamic RAM. When the floating gate FET 3 is conducting, a "0" will be read out. When the floating gate is negatively charged during the non-volatile writing, the floating gate FET is not conducting and a "1" will be read out. The complement of the original data stored before the power down is read out. Simple inverting circuits can be used to invert the data to retrieve the original data.

For normal operation, the floating gate FET 3 needs to be reset to a conductive state. To reset the floating gate FET 3, the data is first read in the normal manner. After the activation of a sense amplifier (not shown), the BL is disconnected from the sense amplifier and is charged up to $V_{DD}$. With the switch 14 connected, the substrate bias is applied to the control gate. As a result of the pulse, a voltage is developed across the second capacitor C2. The voltage is sufficiently large to cause charge flow through C2 and charging of the floating gate FG back to its original charge state. Then the voltage applied to terminal P is returned to $V_{DD}$. The BL is then connected to a circuit which inverts the data stored in the sense amplifier to rewrite the original data into the memory cell. When the word line (not shown) returns to ground, the memory cell is ready for normal operations.

Since a non-volatile write operation, i.e., charge transfer, occurs only when the voltage on the node 4 is at ground, representing a "0" bit of binary information, the first capacitor C1 should have a very much larger capacitance than the second capacitor C2. This arrangement ensures that most of the voltage appearing on the node 4 is across C2. As a result, a large differential voltage is provided which readily distinguishes between a binary bit "1" and a "0".

The advantage of this invention over the previous art (application Ser. No. 219,285) is that node 4 is connected to the bit line during the storage procedure. Therefore, the resulting voltage difference at the floating gate FG can be as big as the voltage difference on the bit line for a binary bit "0" or "1", which is normally equal to $V_{DD}$. Therefore, at or during a data retrieval operation the signal at the storage node 10 is equal to the voltage swing $V_{DD}$.

Figure 6:
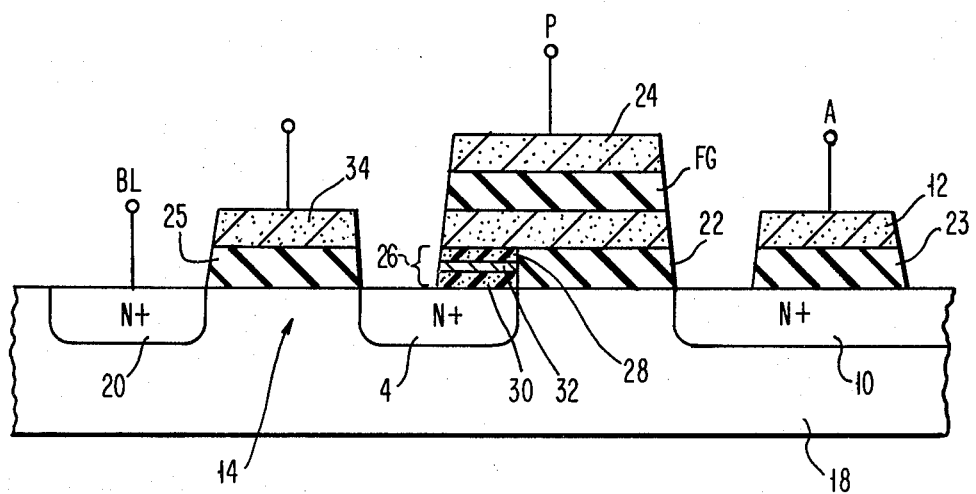

An embodiment of the circuit or cell of the present invention is illustrated in a sectional view in FIG. 6 of the drawings. A P-type silicon substrate 18 has a N+ diffusion region forming the storage node 10, a floating node 4 and a N+ diffusion region 20 forming the bit line connected to terminal BL. The floating gate FG is separated from the substrate 18 by a thin insulating layer 22, preferably made of silicon dioxide, forming the floating gate FET 3. The capacitor C1 is formed by the floating gate FG and a capacitor plate 24, connected to control terminal P.

The floating gate FG extends over the N+ diffusion region of node 4 to form the capacitor C2 which has a dual electron injector structure 26 which includes first and second silicon-rich silicon dioxide layers 28 and 30, respectively, separated by a silicon dioxide layer 32. The storage capacitor $C_S$ is formed by the capacitor plate 12, the storage node 10 and the silicon dioxide layer 23. The switching device or transistor 14 is formed by a gate electrode 34, disposed between the bit/sense line diffusion region 20 and node 4 and separated from the surface of the silicon substrate 18 by the silicon dioxide layer 25. The gate electrode 34 is connected to a word line terminal WL.

Figure 7:
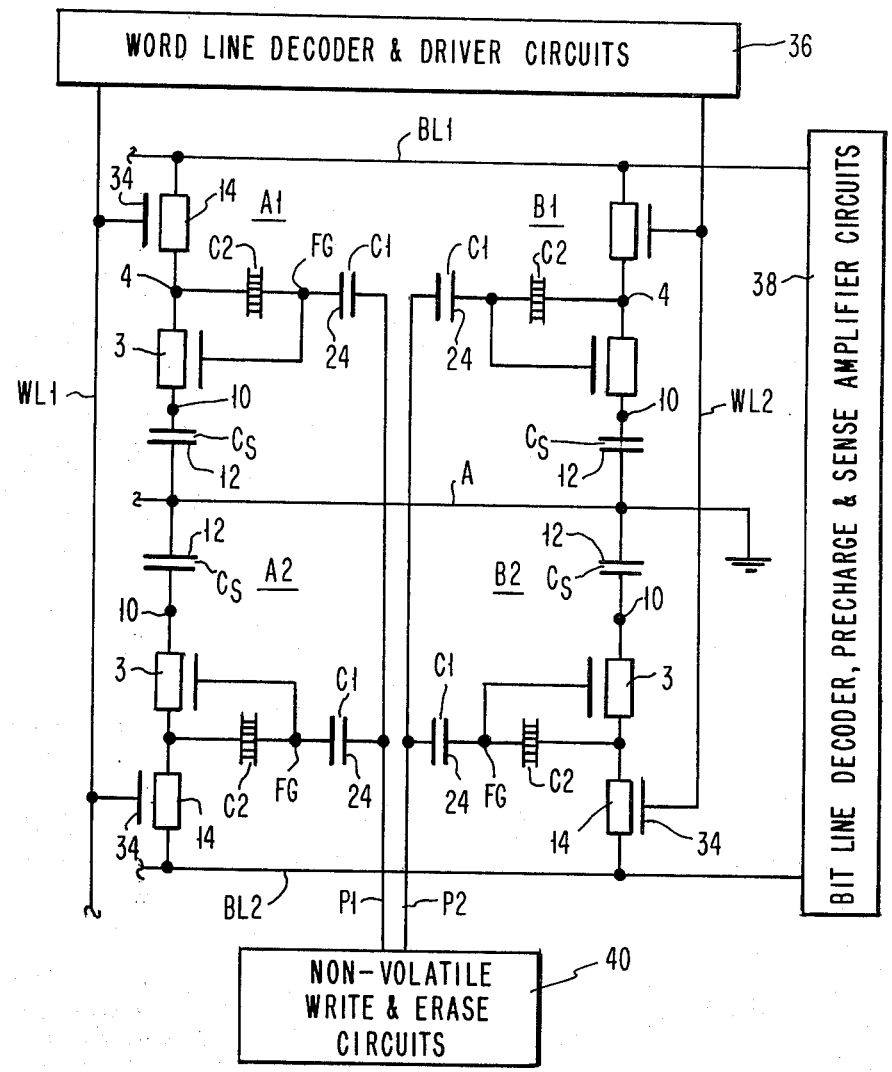
Figure 9:
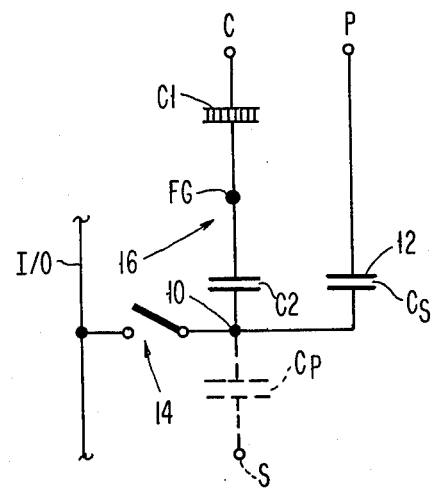
FIG. 9 is a circuit diagram of a prior art non-volatile memory cell.

FIG. 7 illustrates a 2×2 array of non-volatile memory cells of the type shown in FIGS. 5 and 6 of the drawings wherein similar elements in the two figures are identified by the same reference characters. The array includes a first word line WL1 to which first and second cells A1 and A2 are connected and a second line WL2 to which a third cell B1 and fourth cell B2 are connected. First and third cells A1 and B1 are connected to a first bit line BL1 and the second and fourth cells A2 and B2 are connected to a second bit line BL2. The first and second word lines WL1 and WL2 are connected to word line decoder and driver circuit 36 which may employ conventional circuitry and the first and second bit lines BL1 and BL2 are connected to bit line decoder, precharge and sense amplifier circuits 38 which may also utilize conventional circuitry. The control lines P1 and P2 are connected to non-volatile write and erase circuits 40, which may be of any known type.

In order to better understand the operation of the non-volatile memory cell illustrated in FIGS. 5 and 6 and also of the system illustrated in FIG. 7 of the drawings, reference may be had to an illustrative pulse program indicated in FIG. 8 of the drawings. In FIG. 8, a 5 V power supply voltage ($V_{DD}$) and a $-3$ V substrate bias voltage have been assumed. Other convenient voltage levels can also be used. During normal operation of a non-volatile memory cell illustrated, e.g., a cell A1 in FIG. 7 of the drawings, the cell performs as a conventional one device storage circuit coupled to the first bit line BL1 and the first word line WL1 and the voltage therein may be those indicated in FIG. 8 of the drawings between times t1 and t2, with constant voltages being applied to terminals P having a magnitude of, say, $+5$ volts. For a stored binary bit "0", the voltage on storage node 10 is zero volts and for a stored "1", the voltage on storage node 10 is 5 volts. The voltage on the floating gate is about 7 volts. When power failure is detected at t2, the data is first read in normal manner. The sense amplifier will hold the bit line high (5 V) or near ground according to the stored data. With the switch 14 connected, a high positive voltage is applied at t3 to the control gate 24. This potential change on the control gate 24 will be coupled to the floating gate and the resulting voltage change will be dropped across the capacitor C2. The voltage across C2 will be 14 volts for the cell with a binary bit "0" and is sufficient to conduct discharge current from floating gate FG to the N+ diffusion node 4. The result is that the positive charge on the floating gate FG is discharged. In case of a cell storing binary bit "1", the voltage across C2 will be only 9 volts which is designed not to be sufficient to significantly alter the charge on the floating gate FG since this voltage is equal to or less then the turn-on voltage of the dual electron injector structure 26.

Between times t4 and t5, all applied voltages are at zero volts. The potential at storage nodes 4 and 10 will also return to zero volts due to leakage current. The voltage across C2 is less than 4 volts thus the potential of the floating gate FG [$-3$ volts for a cell with binary bit "0" stored and $+1$ volt for a cell with binary bit "1" stored] will be kept for a very long period of time.

When power is again turned on or resumed at t5, the control gate is again biased at 6 volts. To retrieve the data stored before the power down, the conventional means of writing "0" is performed to set the potential at node 4 and node 10 to ground. However, for a cell with a "0" stored node 10 is isolated because the floating gate FET 3 is in a nonconductive state. Between t6 and t7, the cell is read by the conventional means of one device FET dynamic RAM. When the floating gate FET 3 is conducting, a charge sharing between the bit line BL (which is the charged to $V_{DD}$) and the storage node 10 (which is preset to ground) will result in a voltage drop on the bit line BL and thus provide a negative differential signal with respect to the reference signal provided by a reference cell. At t7, the sense amplifier is activated to pull down the bit line to ground and rewrite the potential at storage node 10 to zero. In this case a "0" is read out. For a cell with a "0" stored before the power down, the floating gate FET 3 has been discharged to a nonconductive state; thus the bit line potential will be kept at $V_{DD}$ and this results in a positive differential signal with respect to the reference signal. When the sense amplifier is reactivated this positive differential signal will cause the bit line to be held at $V_{DD}$. In this case, a "1" is read out. Therefore, the data stored before the power down can be retrieved by inverting the read out.

In the case that a "0" was stored before the power down and the floating gate FET 3 has been discharged to a nonconductive state, it is required to reset the floating gate FET 3 to conductive state for normal operation. The reset operation will destroy the information stored in the memory cell. Therefore after the activation of the sense amplifier at t7, the bit line is disconnected from the sense amplifier and the read out is stored in the sense amplifier. At t8, the bit line BL is charged up to 5 volts while the control gate 24 is biased at $-3$ volts. The voltage across C2 will be $-11$ volts for the case that the floating gate FG has been discharged in the power down write operation. This voltage is by design large enough to conduct current from the N+ diffusion node 4 to the floating gate FG and thus to charge the floating gate FG to its original charged state. At t9, bit line is connected to a circuit which inverts the data stored in the sense amplifier to rewrite the data into the memory cell. At t10, the word line returns to ground and the memory cell is ready for normal operation.

As indicated hereinabove, each of the cells A1, A2, B1 and B2 illustrated in the system illustrated in FIG. 7 of the drawings may be operated in accordance with the illustrative pulse program shown in FIG. 8. As also noted hereinabove, cell A1 is operated by selecting word line WL1 and bit/sense line BL1, while cell A2 is operated by selecting word line WL1 and bit/sense line BL2, cell B1 is operated by selecting word line WL2 and bit/sense line BL1 and cell B2 is operated by selecting word line WL2 and bit/sense line BL2. The voltage $V_P$ is produced in non-volatile write and erase circuits which has its own decoder and driver circuits so that only those cells along the energized word line have the write pulses applied to them. In this manner, cells along other word lines are unaffected.

It is also possible to use common control terminal P for all memory cells in an array. During the power failure write operation, the control gate voltage $V_P$ is increasing gradually while the cell is refreshed periodically. As long as during each refresh period, the potential change at node P is small enough, the data will not be disturbed.

However, a temporary storage is required for the data when the floating gate FET is being reset to a conductive state as described hereinabove since the data of an array can not be stored on a column of sense amplifiers.

Having thus described our invention, what we claim as new, and desire to secure by Letters Patent is:

1. A memory cell comprising:
   a storage capacitor having a storage node and a plate,
   means for applying a constant voltage to said plate,
   a control electrode,
   a voltage divider circuit having serially-connected first and second capacitors and a floating gate connected to a common point between said first and second capacitors, said voltage divider circuit being disposed between said control electrode and said storage node,
   a bit line,
   a switching device disposed between said storage node and said bit line, and a floating gate field effect transistor disposed between said storage node and said switching device and said floating gate field effect transistor being controlled by said floating gate.

2. A memory cell as set forth in claim 1 wherein said first capacitor includes a first enhanced conduction insulator.

3. A memory cell as set forth in claim 2 wherein said first capacitor further includes a second enhanced conduction insulator and a given insulating layer disposed between said first and second insulators.

4. A memory cell as set forth in claim 3 wherein said switching device is a transistor.

5. A memory cell as set forth in claim 4 wherein said transistor is a field effect transistor.

6. A memory cell as set forth in claim 5 wherein said first capacitor is disposed between said floating gate and said control electrode and has a capacitance value substantially less than that of second capacitor.

7. A memory cell as set forth in claim 6 further including means for applying a voltage to said control electrode.

8. A memory cell as set forth in claim 7 wherein said means for applying a voltage to said control electrode applies a first voltage having a given magnitude during one period of time and a second voltage having a magnitude substantially lower than that of said given magnitude during another period of time.

9. A memory cell as set forth in claim 8 wherein said given insulating layer includes a silicon dioxide layer and each of said first and second enhanced conduction insulators includes a silicon-rich silicon dioxide layer.

10. A non-volatile dynamic random access memory cell comprising:
a semiconductor substrate,
a storage capacitor having a plate and a storage node disposed in said substrate,
a control electrode,
means for applying a voltage to said control electrode, said voltage having a first magnitude during one period of time and a second magnitude substantially smaller than said first magnitude during another period of time,
a voltage divider circuit having serially-connected first and second capacitors and a floating gate connected to a common point between said first and second capacitors, said voltage divider being disposed between said control electrode and said storage node,
wherein said first capacitor is disposed between said floating gate and said control electrode and has a capacitive value substantially less than that of said second capacitor,
a bit line disposed in said substrate,
a field effect transistor disposed between said storage node and said bit line, and a floating gate FET disposed between said storage node and said field effect transistor, said floating gate FET controlled by said floating gate.

11. A non-volatile dynamic random access memory cell as set forth in claim 10 wherein said first capacitor includes a first enhanced conduction insulator.

12. A non-volatile dynamic random access memory cell as set forth in claim 11 wherein said first capacitor further includes a second enhanced conduction insulator and a given insulating layer disposed between said first and second insulators.

13. A non-volatile dynamic random access memory cell as set forth in claim 12 wherein said first capacitor includes a layer of silicon dioxide and first and second layers of silicon-rich silicon dioxide disposed on opposite sides of said layer of silicon dioxide.

14. A non-volatile dynamic random access memory cell comprising:
a semiconductor substrate,
a storage capacitor having a plate and a storage node disposed in said substrate,
a control electrode,
a switching node,
a switching device,
means for applying a voltage to said control electrode, said voltage having a first magnitude during one period of time and a second magnitude substantially smaller than said first magnitude during another period of time,
a voltage divider circuit having serially-connected first and second capacitors and a floating gate connected to a common point between said first and second capacitors, said voltage divider being disposed between said control electrode and said switching node,
a bit/sense line disposed in said substrate,
a switching device between said storage node and said bit/sense line, and a floating gate FET disposed between said storage node and said switching device said floating gate FET being controlled by said floating gate.

15. A non-volatile dynamic random access memory cell as set forth in claim 14 wherein said first capacitor is disposed between said floating gate and said control electrode and has a capacitance value substantially less than that of said second capacitor.

16. A non-volatile dynamic random access memory cell as set forth in claim 15 wherein said first capacitor includes a first enhanced conduction insulator.

17. A memory cell as set forth in claim 16 wherein said first capacitor further includes a second enhanced conduction insulator and a given insulating layer disposed between said first and second insulators.

18. A non-volatile dynamic random access memory cell as set forth in claim 17 wherein said first capacitor includes a layer of silicon dioxide and first and second layer of silicon-rich silicon dioxide disposed on opposite sides of said layer of silicon dioxide.

19. A memory cell comprising:
a storage capacitor having a storage node and a plate,
means for applying a constant voltage to said plate,
a control electrode,
a switching node,
a voltage divider circuit having serially-connected first and second capacitors and a floating gate connected to a common point between said first and second capacitors, said voltage divider circuit being disposed between said control electrode and said switching node,
a bit line,
a switching device disposed between said switching node and said bit line, and a floating gate field effect transistor disposed between said storage node and said switching node and said floating gate field effect transistor being controlled by said floating gate.

20. A memory cell as set forth in claim 19 wherein said second capacitor includes a first enhanced conduction insulator.

21. A memory cell as set forth in claim 20 wherein said second capacitor further includes a second enhanced conduction insulator and a given insulating layer disposed between said first and second insulators.

22. A memory cell as set forth in claim 21 wherein said switching device is a transistor.

23. A memory cell as set forth in claim 22 wherein said transistor is a field effect transistor.

24. A memory cell as set forth in claim 23 wherein said second capacitor is disposed between said floating gate and said switching node and has a capacitance value substantially less than that of said first capacitor.

25. A memory cell as set forth in claim 24 further including means for applying a voltage to said control electrode.

26. A memory cell as set forth in claim 25 wherein said means for applying a voltage to said control electrode, applies a first voltage having a given magnitude during one period of time and a second voltage having a magnitude substantially lower than that of the given magnitude during another period of time.

27. A memory cell as set forth in claim 26 wherein said given insulating layer includes a silicon dioxide layer and each of said first and second enhanced conduction insulators includes a silicon-rich silicon dioxide layer.

28. A non-volatile dynamic random access memory cell comprising:
a semiconductor substrate,
a storage capacitor having a plate and a storage node disposed in said substrate,
a control electrode,
a switching node,
means for applying a voltage to said control electrode, said voltage having a first magnitude during one period of time and a second magnitude substantially smaller than said first magnitude during another period of time,
a voltage divider circuit having serially-connected first and second capacitors and a floating gate connected to a common point between said first and second capacitors, said voltage divider being disposed between said control electrode and said switching node,
wherein said second capacitor is disposed between said floating gate and said switching node and has a capacitive value substantially less than that of said first capacitor,
a bit line disposed in said substrate,
a field effect transistor disposed between said switching node and said bit line, and a floating gate FET disposed between said storage node and said switching node, said floating gate FET controlled by said floating gate.

29. A non-volatile dynamic random access memory cell as set forth in claim 28 wherein said second capacitor includes a first enhanced conduction insulator.

30. A non-volatile dynamic random access memory cell as set forth in claim 29 wherein said second capacitor further includes a second enhanced conduction insulator and a given insulating layer disposed between said first and second insulators.

31. A non-volatile dynamic random access memory cell as set forth in claim 30 wherein said second capacitor includes a layer of silicon dioxide and first and second layers of silicon-rich silicon dioxide disposed on opposite sides of said layer of silicon dioxide.

* * * * *

UNITED STATES PATENT AND TRADEMARK OFFICE
CERTIFICATE OF CORRECTION

PATENT NO. : 4,432,072
DATED : February 14, 1984
INVENTOR(S) : Chao et al

It is certified that error appears in the above—identified patent and that said Letters Patent is hereby corrected as shown below:

Col. 1, after the title line, insert the following:

--The U.S. Government has a paid-up license in this invention and the right in limited circumstances to require the patent owner to license others on reasonable terms as provided for by the terms of Contract No. MDA 903-81-C-0100 awarded by Defense Advanced Research Projects Agency (DOD) ARPA Order No. 1001/0990, Department of Army, Defense Supply Service-Washington, Washington, D.C. 20310.--

Col. 1, line 63, change "which" to --with--.

Col. 4, line 46, after floating delete the comma.

Col. 11, line 12, change "voltage" to --voltages--.

Signed and Sealed this

Twelfth Day of June 1984

[SEAL]

Attest:

GERALD J. MOSSINGHOFF

Attesting Officer

Commissioner of Patents and Trademarks